United States Patent

Veeman et al.

[11] 3,953,789
[45] Apr. 27, 1976

[54] METHOD OF POLARIZING NUCLEI

[75] Inventors: Wiebren Sjoerd Veeman, Grave, Netherlands; Costantino Sheldon Yannoni, Los Gatos, Calif.

[73] Assignee: International Business Machines Corporation, Armonk, N.Y.

[22] Filed: Nov. 20, 1974

[21] Appl. No.: 525,326

[52] U.S. Cl. .............................. 324/.5 AC; 324/.5 R
[51] Int. Cl.² ......................................... G01R 33/08
[58] Field of Search ..................... 264/24, 22, 2, 26; 324/.5 AC, .5 A, .5 R

[56] References Cited
UNITED STATES PATENTS
3,586,743   6/1971   Van Eeck ............................ 264/24

OTHER PUBLICATIONS
Goldman & Landesman, "Dynamic Polarization by Thermal Mixing between Two Spin Systems", Physical Review, Vol. 132, No. 2, Oct. 15, 1963, pp. 610–620.
Woessner & Gutowsky, "Spin Exchange - - - ", J. of Chem. Physics, Vol. 29, No. 4, Oct., 1958, pp. 804–812.

Primary Examiner—R. V. Rolinec
Assistant Examiner—Michael J. Tokar
Attorney, Agent, or Firm—Joseph E. Kieninger

[57] ABSTRACT

A method of polarizing nuclei having a long relaxation time in a solid in a high DC magnetic field. The solid also contains nuclei having a short relaxation time. The method involves the step of applying a high DC magnetic field to the solid. Then the solid is swept with a radio frequency field which excites the nuclei with a short relaxation time thereby resulting in the polarization of the nuclei having a long relaxation time.

8 Claims, 1 Drawing Figure

U.S. Patent    April 27, 1976    3,953,789
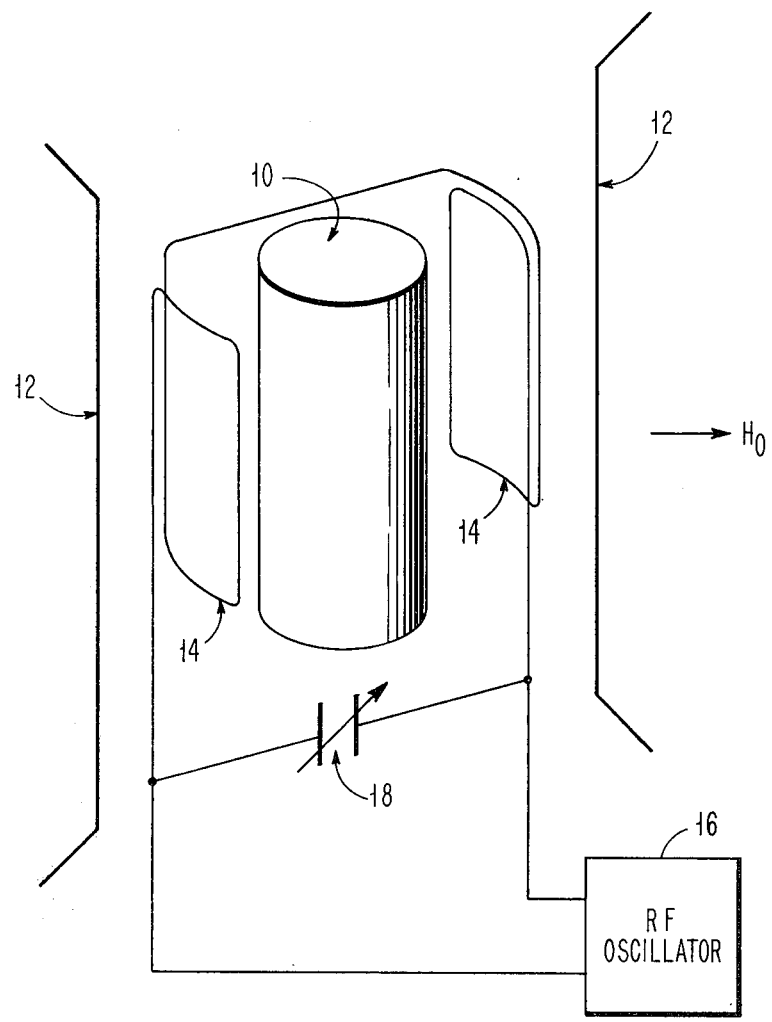

METHOD OF POLARIZING NUCLEI

The invention herein described was made in the course of or under a contract with U.S. Army Research Office, and the United States Government has license therein.

FIELD OF THE INVENTION

This invention relates to nuclear polarization and more particularly to a method for polarizing nuclei having a long relaxation time.

DESCRIPTION OF THE PRIOR ART

In nuclear magnetic resonance (NMR), polarization of nuclear spins, that is, nuclear magnetic dipole moments, is necessary in order to observe NMR phenomena. In NMR experiments on solids, it is frequently necessary to work with nuclei having a long relaxation time. The relaxation time ($T_1$) is sometimes referred to as the polarization time. In many solids containing nuclei having a long relaxation time, it is often impractical to carry out NMR experiments because it is necessary to wait so long for the nuclear spin polarization to develop.

Several prior art methods have attempted to overcome this difficulty by taking advantage of the short relaxation time of the other nuclei present in the solid. This approach is referred to as cross-relaxation. One such method is described in the Journal of Chemical Physics, Vol. 29, No. 4 (October 1958), pp. 804-812. In this method, the solid sample is placed in a DC magnetic field of a given strength and rotated slowly about an axis perpendicular to the direction of the lines of force of the DC field. This method requires a DC magnetic field of a given strength which may not be desriable for the subsequent NMR experiment.

Another method is described in the Physical Review, Vol. 132, No. 2 (Oct. 15, 1963), p. 610. In this method, the solid sample is placed in a DC magnetic field of very low strength and a radio frequency field is applied at a fixed frequency to the sample, the fixed frequency corresponding to the resonant frequency of the nucleus with a short relaxation time. This method has the disadvantage or requiring a low DC magnetic field which may not be desirable for the subsequent NMR experiment.

SUMMARY OF THE INVENTION

It is a primary object of this invention to provide an improved method for polarizing nuclei having a long relaxation time in a solid.

It is another object of this invention to provide an improved method for polarizing nuclei having a long relaxation time in a solid in a high DC magnetic field.

It is yet another object of this invention to provide an improved method for polarizing nuclei having a long relaxation time in a solid in a DC magnetic field of an arbitrarily selected strength.

These and other objects of this invention are accomplished by a method involving the steps of applying a high DC magnetic field of arbitrarily selected strength to the solid and subsequently sweeping the solid with a radio frequency field which is sufficient to excite a significant number of the nuclei having a short relaxation time for a time which is at least as long as the time required to polarize the nuclei having a long relaxation time.

Other objects and advantages of this invention will be apparent from the following detailed description wherein a preferred embodiment of the present invention is clearly shown.

BRIEF DESCRIPTION OF THE DRAWINGS

The drawing shows a schematic view of the apparatus employed in carrying out the method of this invention.

DETAILED DESCRIPTION OF THE INVENTION

As shown in the drawing, a solid 10 is placed in a DC magnetic field applied by a magnet 12. The solid 10 may be placed in a container (not shown) if in the form of a powder or otherwise desired. Liquid or gas samples may be treated by this process if they are cooled to their solid state and maintained in the solid state during the polarization process. Certain nuclei have short relaxation times. Examples of nuclei having short relaxation times are: $^{35}Cl$, $^{81}Br$, $^{79}Br$, $^{127}I$ and $^{14}N$. Certain nuclei have long relaxation times. Examples of nuclei having long relaxation times which may be polarized by the method of this invention are: $^{1}H$, $^{13}C$ and $^{19}F$.

The strength of the DC magnetic field, $H_0$, supplied by the magnet 12 can be arbitrarily selected to optimize the subsequent NMR experiment which will be carried out on the polarized nuclei obtained from the process of this invention. In most instances, it is most desirable to carry out the NMR experiment with as high as DC magnetic field strength as possible. The definition of "high field" as used in this invention is from 1000 to 100,000 gauss or even higher, if desired. The preferred range for NMR work is between 10,000 and 75,000 gauss. One of the primary features of this invention is that the field strength for the polarization method can be chosen at a value which is optimal for the subsequent NMR experiment.

As shown in the drawing, an RF coil 14 is positioned about the sample 10. The RF coil 14 is connected to an RF oscillator 16. The frequency of the RF field generated within the RF coil 14 is changed by varying the value of the variable capacitor 18. The frequency of the RF field generated within the RF coil 14 which surrounds the sample 10 is swept, that is, varied. The frequency is swept over a particular range depending upon the field strength of the DC magnetic field and the particular type of nuclei with a short relaxation time. The sweeping may be done either from low frequency to high frequency, for example, from 27 to 41 MHz. The sweeping may be from high frequency to low frequency, for example, 41 to 27 MHz, or a combination of both of these, for example, 27 to 41 to 27 MHz. More than one sweep in a given direction may be employed. Additional sweeps in a given direction increase the polarization up to a certain point at which additional sweeps in the same direction yield no further increase in polarization. Sweeps may vary in time from 1 to 2 seconds up to over 15 seconds. A sweep time of about 15 seconds is preferred when a single sweep is made. The time of a sweep depends on size of the frequency range that is swept. Larger frequency range sweeps require proportionally longer sweep times.

The rate of the sweep varies from 0.9 to 2.8 MHz/second.

The frequency range over which the solid is swept depends upon the DC field that is applied as well as the particular nuclei having a short relaxation time. The following table shows estimates of frequency ranges for particular nuclei at various field strengths.

| Material | Nuclei | Field Strength, $H_0$, gauss | | | |
|---|---|---|---|---|---|
| | | 1000 | 10,000 | 50,000 | 100,000 |
| | | Frequency, MHz | | | |
| 1,4-dichlorobenzene | $^{35}Cl$ | 34–35.6 | 26–43 | 66–101 | 149–184 |
| 1,4-dibromobenzene | $^{81}Br$ | 224–229 | 205–248 | 100–326 | 314–540 |
| 1,4-dibromobenzene | $^{79}Br$ | 269–273 | 248–295 | 95–365 | 325–595 |
| 1,4-diiodobenzene[a] | $^{127}I$ | 273–277 | 258–292 | 190–360 | 204–478 |
| | $^{127}I$ | 549–551 | 542–558 | 507–593 | 465–635 |
| acetonitrile | $^{14}N$ | 2.5–3.1 | 1.7–4.5 | 14–16.8 | 29.4–32.2 |

[a]Two frequency ranges at each field strength.

EXAMPLE I

A solid, 1,4-dichlorobenzene, containing nuclei $^1H$ and $^{13}C$ having long relaxation times. The sample also contained $^{35}Cl$ nuclei having a short relaxation time. The solid was placed in a DC magnetic field of 5400 gauss. The strength of this field was selected to coincide with the strength of the $H_0$ for a particular NMR apparatus which would subsequently be used to make tests on the polarized proton, $^1H$, nuclei. Then the solid was swept with a radio frequency starting at 27 MHz and ending with 41 MHz. This sweeping step took 5 seconds. This method polarized the $^1H$ nuclei to within 50% ± 10% of the full equilibrium polarization.

EXAMPLE II

Same as Example I except that the sweep took 15 seconds instead of 5 seconds as in Example I. The polarization of $^1H$ was 80% ± 10% of the full equilibrium polarization.

EXAMPLE III

Same as Example I except that the sweep took 7 seconds. Then the sweeping step was performed 5 more times, each sweep taking 7 seconds. The polarization of $^1H$ was 90 to 95% ± 10% of the full equilibrium polarization.

EXAMPLES IV–VII

The $^1H$ nuclei were polarized as describe in Example I at 5400 gauss using a 5 second sweep over the frequency range of 27 to 41 MHz in the following compounds:
1,3,5-trichlorobenzene
1,2,4,5-tetrachlorobenzene
2,5-dichlorobenzoquinone
2,6-dichlorobenzoquinone

EXAMPLE VIII

The $^{19}F$ nuclei were polarized at 5750 gauss using a 5 second sweep over the frequency range of 27 to 41 MHz in 1,3,5-trifluoro-2,4,6-trichlorobenzene.

What is claimed is:

1. A method for polarizing first nuclei having a long relaxation time in a solid in a high DC magnetic field where said solid contains first nuclei having long relaxation times and second nuclei having short relaxation times comprising the steps of
applying a DC magnetic field having a strength above 1000 gauss to said solid, and
sweeping said solid with a radio frequency field sufficient to excite a significant number of said second nuclei for a time which is at least as long as the time required to polarize said first nuclei.

2. A method as described in claim 1 whereby the DC magnetic field has a magnitude between 10,000 and 75,000 gauss.

3. A method as described in claim 1 whereby said sweeping step is from a specific frequency to a higher frequency.

4. A method as described in claim 1 whereby said sweeping step is from a specific frequency to a lower frequency.

5. A method as described in claim 1 whereby said sweeping step is performed at a rate of from 0.9 to 2.8 MHz/sec.

6. A method for polarizing nuclei having a long relaxation time in a solid in a high DC magnetic field where said solid contains first nuclei having long relaxation times and second nuclei having short relaxation times comprising the steps of
applying a DC magnetic field having a strength above 1000 gauss to said solid,
sweeping said solid with a radio frequency field sufficient to excite a significant number of said second nuclei for a time which is at least as long as the time required to polarize said first nuclei, and
sweeping said solid at least one additional time with a radio frequency field sufficient to excite a significant number of said second nuclei for a time which is at least as long as the time required to polarize said first nuclei.

7. A method as described in claim 6 whereby said second sweeping step is in the same direction as said first sweeping step.

8. A method as described in claim 6 whereby said second sweeping step is in a different direction from said first sweeping step.

* * * * *